(12) United States Patent
Kaluzhny et al.

(10) Patent No.: US 9,269,454 B1
(45) Date of Patent: Feb. 23, 2016

(54) COUNTER USING ONE-TIME-PROGRAMMABLE MEMORY

(71) Applicant: Winbond Electronics Corporation, Zhubei (TW)

(72) Inventors: Uri Kaluzhny, Beit Shernesh (IL); David Harbater, Ra'anana (IL)

(73) Assignee: WINBOUND ELECTRONICS CORPORATION, Zhubei (TW)

( * ) Notice: Subject to any disclaimer, the term of this patent is extended or adjusted under 35 U.S.C. 154(b) by 0 days.

(21) Appl. No.: 14/558,818

(22) Filed: Dec. 3, 2014

(51) Int. Cl.
*G11C 17/00* (2006.01)
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ...... G11C 5/025; G11C 5/063; G11C 11/401; G11C 11/4074; G11C 11/4076; G11C 11/4097; G11C 11/4099; G11C 2029/0407; G11C 29/021; G11C 29/028; G11C 29/12; G11C 29/12005; G11C 29/46
USPC ............ 365/51, 189.05, 200, 189.02, 189.03, 365/189.09, 193, 201, 226, 230.01, 230.03, 365/238.5, 63
See application file for complete search history.

(56) References Cited

U.S. PATENT DOCUMENTS

2005/0081011 A1* 4/2005 Kowshik ............. G06F 13/4243
711/167

* cited by examiner

*Primary Examiner* — Thong Q Le
(74) *Attorney, Agent, or Firm* — D. Kligler IP Services Ltd.

(57) ABSTRACT

A method, including receiving a sequence of events to be counted. The method further includes, in response to each event, setting a respective bit in a memory that consists of multiple words organized in tiers, such that a number of set bits in the memory is indicative of a count of the received events, and such that each set bit in a first tier corresponds to a respective word in a second tier and is indicative of whether the corresponding word is fully populated with set bits.

13 Claims, 8 Drawing Sheets

US 9,269,454 B1

COUNTER USING ONE-TIME-PROGRAMMABLE MEMORY

FIELD OF THE INVENTION

The present invention relates generally to memory devices, and particularly to methods and systems for counter implementation in non-volatile memory.

BACKGROUND OF THE INVENTION

A one-time-programmable OTP memory, also known as a "write-once" memory is a non-volatile memory wherein an erase function is typically not possible. In other non-volatile memories, such as Flash memories, the erase function may be possible but is typically time-consuming.

Both types of memories, as well as other types, may be used for counting events. For example, as each event happens, a bit in the memory may be set. To calculate the number of events that have occurred, the number of set bits in the memory is counted.

SUMMARY OF THE INVENTION

An embodiment of the present invention provides a method, including:

receiving a sequence of events to be counted; and in response to each event, setting a respective bit in a memory that includes multiple words organized in tiers, such that a number of set bits in the memory is indicative of a count of the received events, and such that each set bit in a first tier corresponds to a respective word in a second tier and is indicative of whether the corresponding word is fully populated with set bits.

In a disclosed embodiment the method also includes:

reading a first number of set bits in a first single word in the first tier;

reading a second number of set bits in a second single word in the second tier pointed to by a first function of the first number; and evaluating the count of the received events as a second function of the first number and the second number.

In a further disclosed embodiment the memory includes a third tier, such that each set bit in the second tier corresponds to a respective further word in the third tier and is indicative of whether the corresponding further word is fully populated with set bits. Typically, each word of the multiple words has n bits, n≥2, and the first tier includes a single word, the second tier includes (n+1) words, and the third tier includes $(n+1)^2$ words.

The further disclosed embodiment may further include:

reading a first number A of set bits in the single word of the first tier;

reading a second number B of set bits in a second single word in the second tier pointed to by a first function (A+1);

reading a third number C of set bits in a third single word in the third tier pointed to by a second function (n+1)·A+B+(n+2); and evaluating the count of the received events as $A \cdot (n+1)^2 + B \cdot (n+1) + C$.

In a yet further disclosed embodiment the method includes:
receiving a subsequent event to be counted; and determining a corresponding bit in the memory to set by sequentially examining the first and the second tier to determine a first word that is not fully populated, wherein the corresponding bit includes an unset bit in the first word.

There is further provided, according to an embodiment of the present invention a method, including:

providing a main memory that includes a plurality of words, such that a number of set bits in the main memory is indicative of a count of received events;

mapping addresses of the plurality of words to respective one or more addresses of one or more words, less than the plurality, in a test memory;

connecting counter logic, configured to set bits in the main memory in response to receiving events, via the mapping to the test memory;

configuring the counter logic to simulate receiving events so as to set bits in the test memory in response to the mapping; and configuring the counter logic to evaluate the set bits in the test memory so as to test the counter logic.

There is further provided, according to an embodiment of the present invention apparatus, including:

a memory including multiple words organized in tiers, such that a number of set bits in the memory is indicative of a count of received events, and such that each set bit in a first tier corresponds to a respective word in a second tier and is indicative of whether the corresponding word is fully populated with set bits; and counter logic, configured to receive a sequence of events to be counted, and in response to each received event to set a respective bit in the memory.

There is further provided, according to an embodiment of the present invention, apparatus, including:

a main memory including a plurality of words, such that a number of set bits in the main memory is indicative of a count of received events;

a test memory, including one or more words less than the plurality of words in the main memory;

a mapping device mapping addresses of the plurality of words to respective one or more addresses of the one or more words of the test memory; and counter logic, configured to set bits in the main memory in response to receiving events, connected via the mapping device to the test memory, the counter logic being further configured to simulate receiving events so as to set bits in the test memory in response to the mapping, and to evaluate the set bits in the test memory so as to test the counter logic.

The present invention will be more fully understood from the following detailed description of the embodiments thereof, taken together with the drawings in which:

DETAILED DESCRIPTION OF EMBODIMENTS

Overview

An embodiment of the present invention provides a method for counting events by setting bits in a memory, typically a one-time-programmable (OTP) memory. Words of the memory, also referred to herein as a main memory, are in one homogenous array that is organized in two or more tiers, each tier having one or more words. Counter logic receives a sequence of events to be counted, and in response to each event sets, i.e., programs, a single bit in the memory. The number of set bits corresponds to the count of the received events. The logic may set unset bits of the memory sequentially, so as to eventually fully populate words; alternatively, the logic may set unset bits in any order. The bits are set so that each set bit in a first, "higher," tier corresponds to a respective word in a second, "lower," tier that is fully populated. In counting events, no bits in the memory are erased.

By setting the bits of the memory in the manner described above, the logic is able to count the number of events that have been recorded in the memory by inspecting the number of bits in one selected word of each tier. Thus, for a three tier memory, only three words need to be read in order for the count recorded in the memory to be completely determined. This compares to prior art counting systems, where significantly more reads need to be made in order to determine the count in the memory.

In order to decide which bit to set for an incoming event, the logic first inspects selected words mentioned above, i.e., one word in each tier. From the inspection the logic is able to select the word wherein the event is to be recorded, and the event is recorded by setting one more bit in the selected word. The bit set within a word may be set in any order.

An embodiment of the present invention also provides a method for efficiently testing the counter logic. The logic may be switched to operate in a test mode, wherein read and program addresses of the words of the main memory are mapped to a substantially reduced number of addresses, possibly only one address, of words in a test memory. The logic is not aware of the switch, and functions exactly as described above actually working with the test memory. Using a test memory in this manner significantly shortens the time for testing the logic, compared to the time that would be needed if the main memory itself is programmed.

System Description

Figure 1:
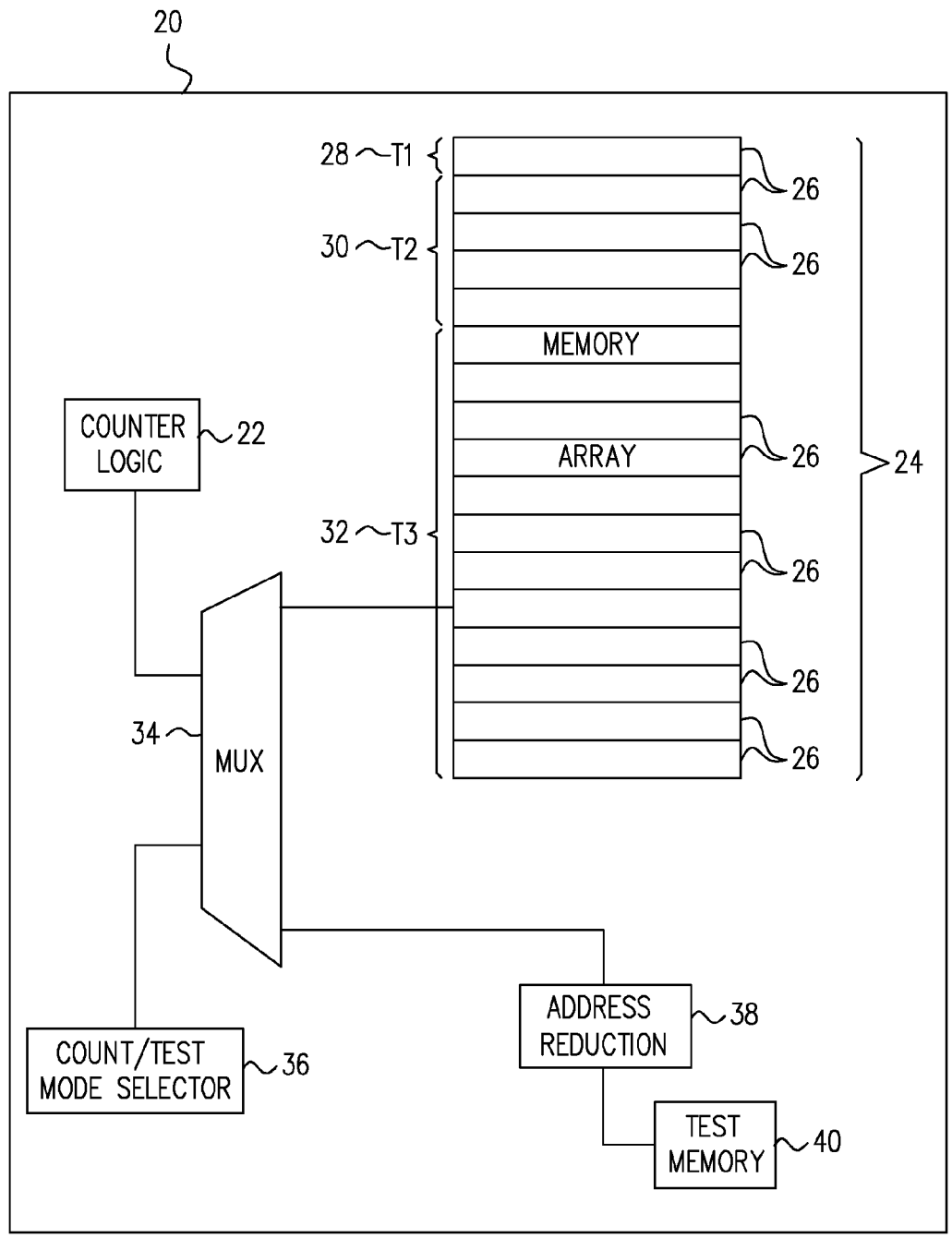
FIG. 1 is a block diagram that schematically illustrates a memory system, in accordance with an embodiment of the present invention.

FIG. 1 is a block diagram that schematically illustrates a memory system 20, in accordance with an embodiment of the present invention.

System 20 may be used in any suitable application, such as Solid-State Disks (SSDs), computing devices, mobile phones or other communication terminals, removable memory modules such as Disk-On-Key (DOK) devices, Secure Digital (SD) cards, Multi-Media Cards (MMCs) and embedded MMCs (eMMC), digital cameras, music and other media players and/or any other system or device in which data is stored and retrieved.

System 20 comprises a memory array 24, which is configured to store data in memory cells that are grouped in multiple words 26. Memory array 24 is also referred to herein main memory 24. As is explained in more detail below, multiple words 26 are grouped into three tiers. System 20 also comprises a test memory 40 which comprises memory cells but typically contains a significantly reduced memory volume compared to array 24. System 20 also comprises a counter logic 22, which is configured to count events in array 26 and in test memory 40, and a count/test mode selector 36 which enables toggling between a test mode and a count mode related to test memory 40 and memory array 24 respectively.

In addition, system 20 comprises a multiplexer (MUX) 34, which is configured to apply the toggling between the test and count modes, and an address reduction device 38, which is configured to map the main memory space to the test memory, so that several addresses are mapped to one address in the test memory.

Embodiments of the present invention that are described hereinbelow refer to operations in which a processing unit is required to count events and record their number into a memory. The following description assumes the memory is non-volatile, and those having ordinary skill in the art will be able to adapt the description for a volatile memory. In the example of FIG. 1, memory array 24 is configured to be programmed bit-by-bit, but an erase operation in array 24 may be either impossible, e.g., in "One time programmable" (OTP) or "write-once" memory devices, or expensive, due to its long duration. In embodiments of the present invention a counted event is recorded as a programmed or set bit, and the number of events counted by counter logic 22 is represented by the number of the programmed bits in array 24.

In the example of FIG. 1, array 24 comprises three tiers. A first tier 28 (also denoted tier 1 or T1) comprises a single word 26, which, by way of example, comprises 32 bits. A second tier 30 (also denoted tier 2 or T2) comprises 33 words of 32 bits each, and a third tier 32 (also denoted tier 3 or T3) comprises 1089 words of 32 bits each. In upper tiers, every bit corresponds to a fully populated word in a next lower tier. For example, every bit in T1 corresponds to a respective full word in T2, and similarly, every bit in T2 corresponds to a respective full word in T3.

In the count mode, counter logic 22 determines the number of programmed bits, and the address of the next bit to be programmed in a substantially reduced set of read operations compared to counting operations in prior art memory systems. The count mode comprises reading and programming operations. During the reading operation, counter logic 22 reads bits already programmed in memory array 24. During the programming operation, counter logic 22 navigates to the next cell-to-be-programmed in memory array 24, and programs the next bit, which represents the next count. The count mode is described below in relation to FIGS. 3-6.

In the test mode, system 20 checks the counter logic. In this mode, the address reduction device maps words in the memory array into one or more words in test memory 40. The number of words in the test memory is typically chosen to be significantly fewer than the number in array 24. Having fewer words in the test memory causes the counter logic to advance in larger increments, compared to its behavior with array 24, when it always increments by one count. The test mode is described in relation to FIGS. 7-8.

System 20 toggles between the count mode and the test mode using selector 36, which activates MUX 34 to toggle between the modes.

The configuration of memory system 20 shown in FIG. 1 is an example configuration, which is chosen purely for the sake of conceptual clarity. Certain elements of memory system 20 can be implemented using hardware, such as using one or more Application-Specific Integrated Circuits (ASICs) or Field-Programmable Gate Arrays (FPGAs) or other device types. Additionally or alternatively, certain elements of memory system 20 can be implemented using software, or using a combination of hardware and software elements.

Counter logic 22 typically comprises a processor, which is programmed in software to carry out the functions described herein. The software may be downloaded to the processor in an electronic form, over a network, for example, or it may, alternatively or additionally, be provided and/or stored on non-transitory tangible media, such as magnetic, optical, or electronic memory.

In the following description, memory array 24 is assumed to comprise a non-volatile NAND Flash device, although any other memory type, such as NOR and Flash cells, phase change RAM (PRAM, also referred to as Phase Change Memory—PCM), Nitride Read Only Memory (NROM), Ferroelectric RAM (FRAM) and/or magnetic RAM (MRAM), can also be used. The disclosed techniques are applicable in various two-dimensional and three-dimensional memory device configurations.

Figure 2:
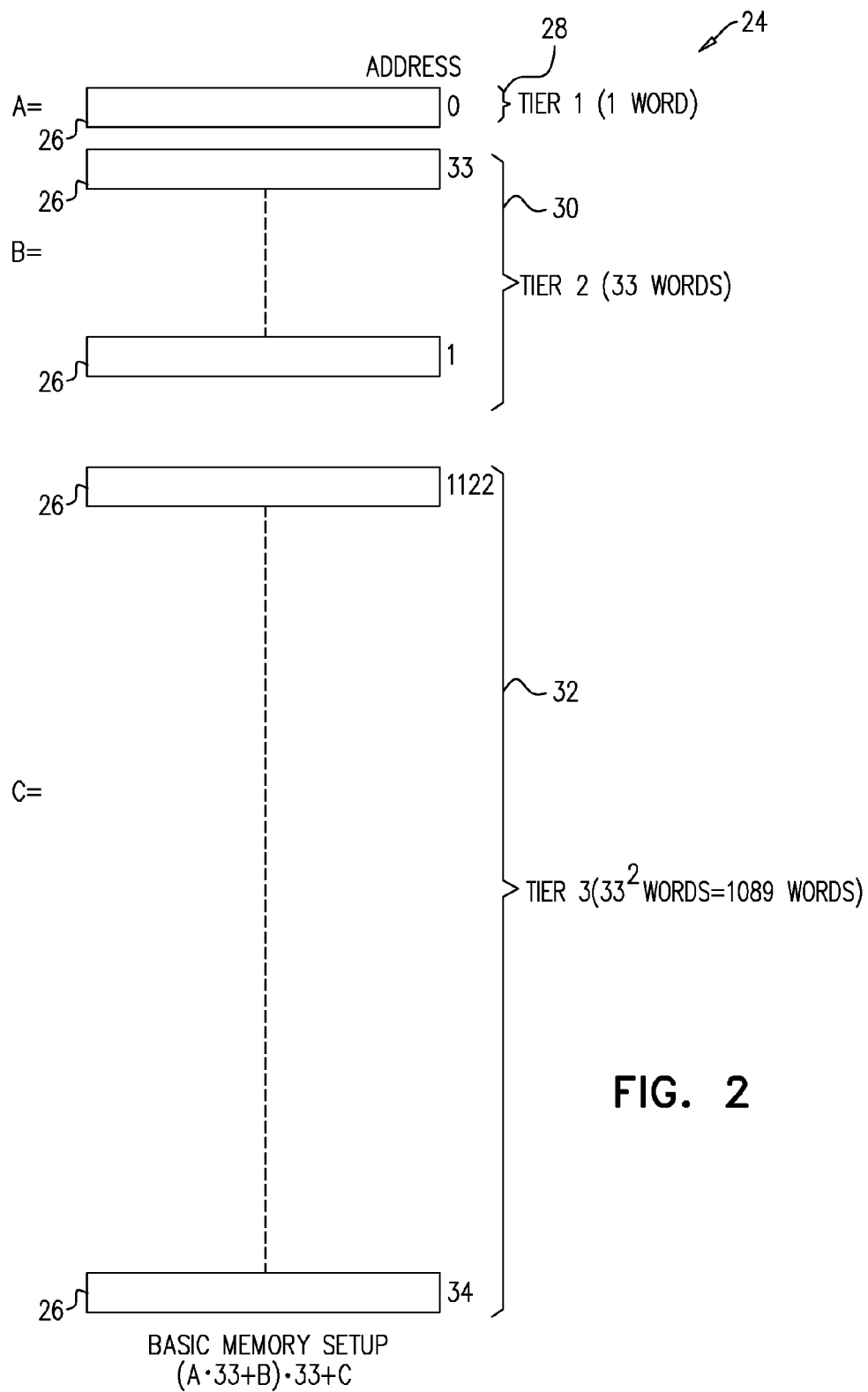
FIG. 2 is a block diagram that schematically illustrates a basic memory setup, in accordance with an embodiment of the present invention.

FIG. 2 is a block diagram that schematically illustrates a basic setup of memory array 24, in accordance with an embodiment of the present invention. As stated above, array 24 comprises three tiers, denoted T1, T2 and T3. T1 comprises a single word of 32 bits. T2 comprises 33 words of 32 bits each, and T3 comprises 1089 words ($33^2$) of 32 bits each.

Figure 3:
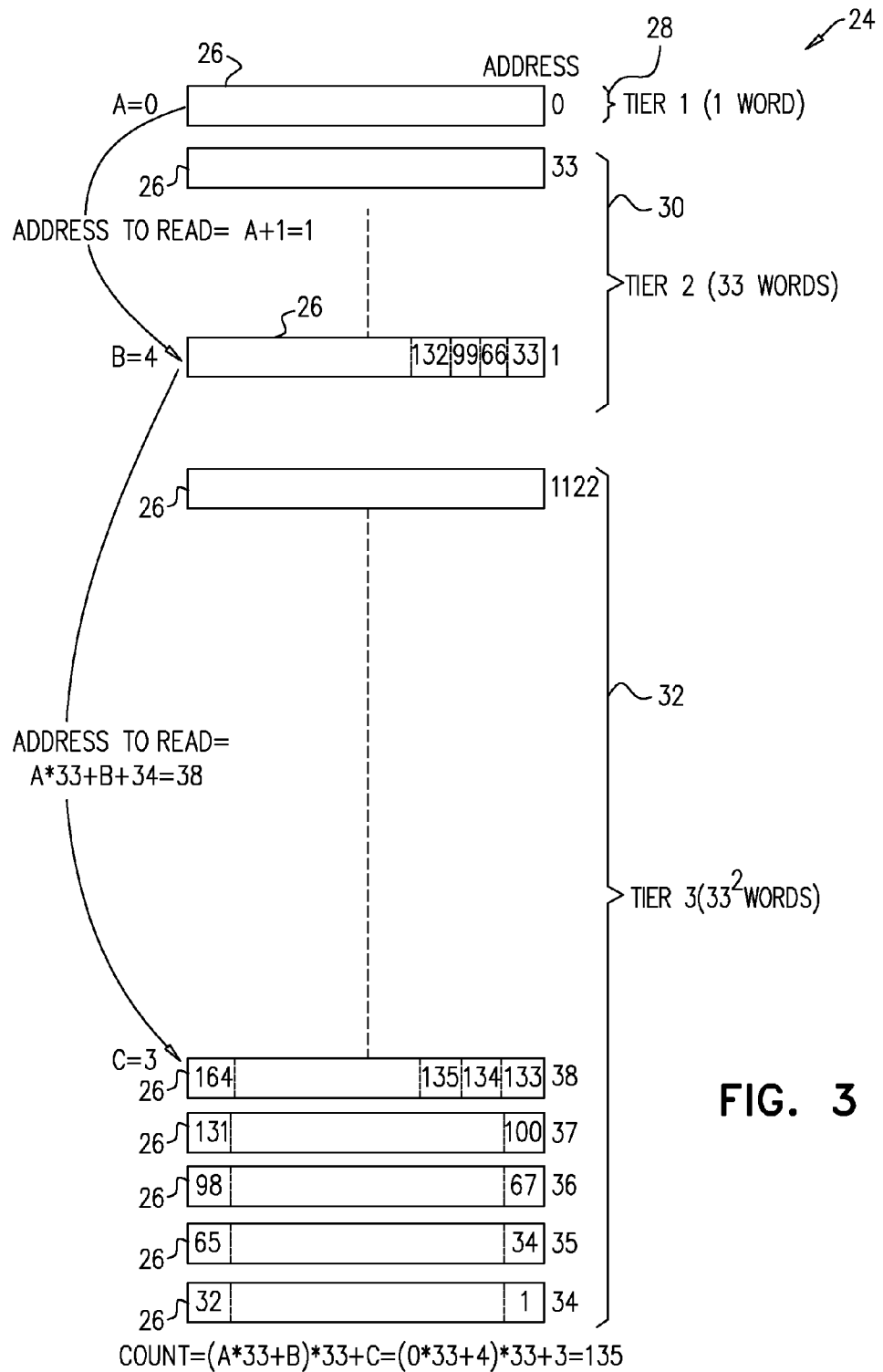
FIGS. 3-4 are block diagrams that schematically illustrate counter operations in a memory system, in accordance with an embodiment of the present invention.
Figure 4:
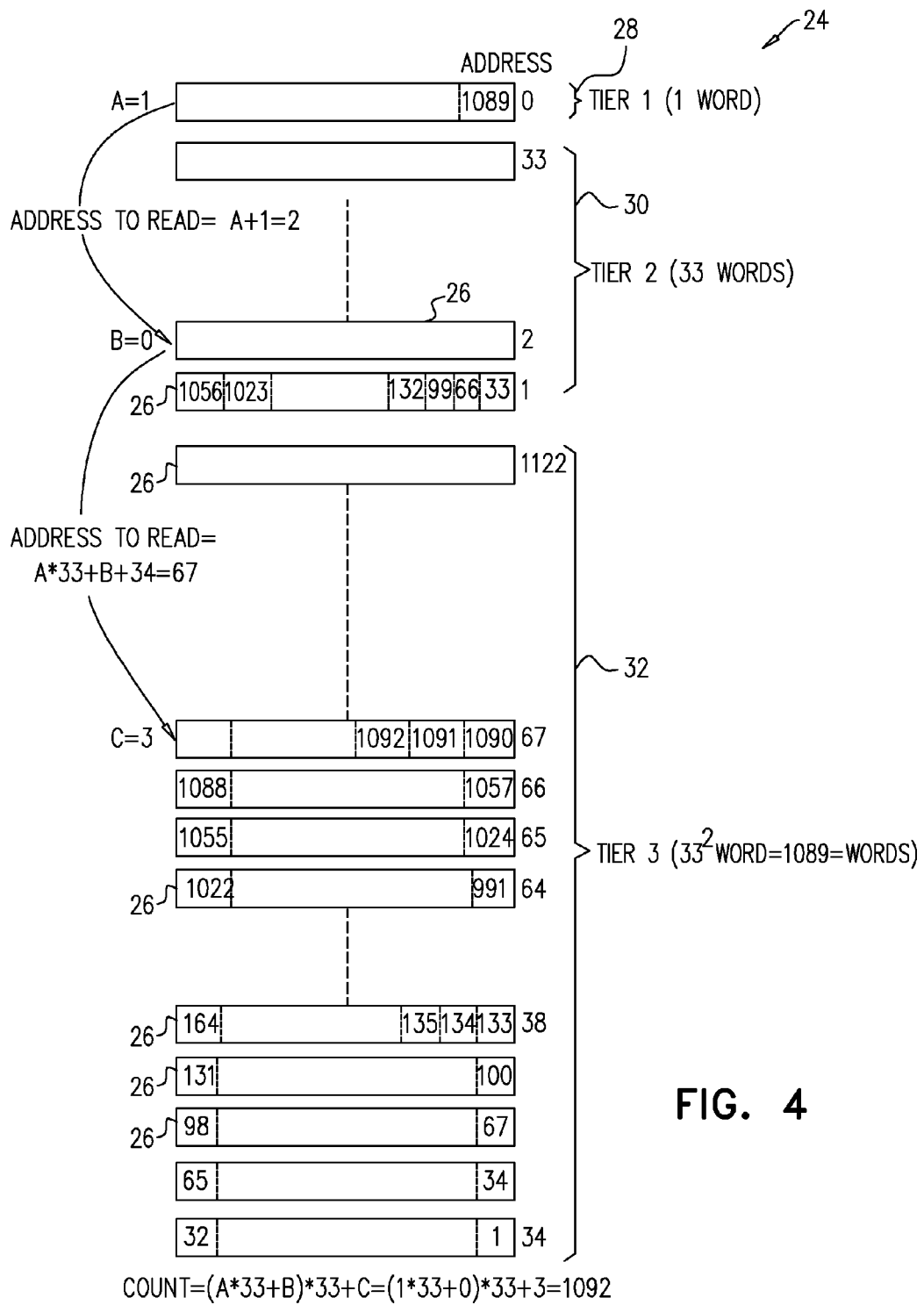

Every word 26 is programmed sequentially (as will be detailed in reference to FIGS. 3-4). Initially when the count is zero, all bits in array 24 have a "zero" (0) value. In the first count, counter logic 22 programs, or sets, a bit in the word of tier 3 having the lowest address with a "1" value, leaving "0" in all other 31 bits. After the second count, two bits in the word have a "1" value and all remaining 30 bits are "0". Each succeeding count programs, or sets, a next "0" bit to "1". (In some embodiments, the bits within a word are set in order, for example from a lowest bit to a highest bit. In other embodiments the bits of a word are set in any arbitrary order.)

According to this sequential programming, every word comprises 33 values: from zero set bits to 32 set bits, and each single set bit represents a counted event.

The words, because they are within a single main memory array 24, have addresses which are numbered according to their tiers. T1 comprises a single word, having address 0 (zero). T2 comprises 33 words, having addresses 1-33. T3 comprises 1089 words, having addresses (the lowest address in the tier)—1122. In the present disclosure the words are also referred to by their addresses, for example, word 0, word 1, and word 33.

"A", "B", and "C" are variables; "A" represents a number of programmed bits in the (only) word of T1, "B" represents a number of programmed bits in the word in T2 pointed to by an expression A+1. The word pointed to has an address A+1. "C" represents a number of programmed bits in the word of T3 pointed by using variables "A" and "B" in an expression 33·A+B+34. The word pointed to in this case has an address 33·A+B+34. Accordingly, the variables "A", "B", and "C" may comprise any value between 0 and 32.

A formula: (A·33+B)·33+C provides the number of events counted by count logic 22, as will be demonstrated in reference to FIGS. 3-4 below. In the examples illustrated by FIGS. 3 and 4, for simplicity it is assumed that bits within a word are set from a lowest bit to a highest bit. However, it will be understood that in general the bits within a word may be set in any arbitrary order.

FIG. 3 is a block diagram that schematically illustrates an example of counter logic 22 operations in memory array 24, in accordance with an embodiment of the present invention. The example of FIG. 3 demonstrates how counter logic 22 counts 135 events by programming them in array 24.

The first event is programmed into word 34 of T3 by setting the lowest bit of the word, and the next 31 events are programmed by sequentially setting, from the lowest bit to the highest bit, the bits of the same word. Thus, event 32 is represented by setting the highest bit in word 34. At this point word 34 is fully populated, so the counter logic programs the next event, event 33, by setting the lowest bit in word 1 of T2. The next event, event 34, is programmed in word 35 of T3 by setting the lowest bit of the word. As is explained in more detail below, if the array is read at this point, variable "A" equals zero (as no bits are programmed in word 0), variable "B" equals 1 (as one bit is programmed in word A+1 of T2), and variable "C" equals 1 (as one bit is programmed in word 33·A+B+34 of T3). By placing variables A, B, and C in the formula: (A·33+B)·33+C, one obtains (0·33+1)·33+1, which equals 34, in accordance with the current count (34) of counter logic 22.

Events 35-65 sequentially set the bits of word 35. Event 65 is programmed by setting the highest bit of word 35, so that at this point word 35 is fully populated. Because word 35 is fully populated the counter logic programs the next event, event 66, by setting the next available, i.e., the lowest unset, bit in word 1 of T2.

Event 67 is programmed by setting the lowest bit in word 36 of T3. The event counting continues, sequentially filling word 36 to event 98, at which point word 36 is fully populated, and the next event, event 99, is programmed by setting the next available bit of word 1 of T2.

Events 100-131 fully populate word 37, so that event 132 is programmed by setting the next available bit of word 1 of T2. The next three events are programmed by sequentially setting the lowest three bits, from the lowest bit, of word 38.

Reading the array at this point no bits are programmed in word 0, and variable "A" is still zero, four bits are programmed in word A+1 of T2, and thus variable "B" equals 4. Similarly, three bits are programmed in word 33·A+B+34, i.e., word 38, which is the currently-programmed word of T3, and thus variable "C" equals 3.

Placing the variables in the formula referred to above provides: (0·33+4)·33+3, which equals 135 as shown at the bottom of FIG. 3, and in accordance with the current count of counter logic 22.

FIG. 4 is a block diagram that schematically illustrates another example of counter logic 22 operations in memory array 24, in accordance with an embodiment of the present invention. The example of FIG. 4 demonstrates how counter logic 22 counts 1092 events by programming them in array 24. Events 1-1055 completely fill words 34-65 in T3, and as each word in T3 is filled, the next event is registered by the logic setting the next available unset bit word 1 of tier T2, using the same methodology as is described in FIG. 3.

Thus the counter logic counts event 1056 by setting the next available bit in word 1, which in this case is the highest bit of the word. Events 1057-1088 sequentially fill, until it is fully populated, word 66.

At event 1089, the counter logic registers that word 1 of T2 (as well as word 66 of T3) is fully populated. In this case the logic registers the event by setting the first available unset bit of word 0 in T1, i.e., the lowest bit of word 0.

The counter logic counts subsequent events, in this example events 1090-1092, by sequentially setting unset bits in word 67 of T3, beginning with the lowest bit.

If the array is read at this point, one bit is programmed in word 0 of T1, and thus, variable "A" equals 1. In T2, word A+1, i.e., word 2, is empty, and thus the variable "B" equals 0. In T3, word 33·A+B+34, i.e., word 67, comprises three bits (corresponding to events 1090-1092), and thus variable "C" equals 3.

Placing the variables in the formula provides: (1·33+0)·33+3, which equals 1092 as shown at the bottom of FIG. 4, and in accordance with the current count of counter logic 22.

Inspection of FIGS. 3 and 4 demonstrates that each set bit in an upper tier indicates that a corresponding word in the next lower tier is fully populated. Thus, in FIG. 3, the lowest set bit of word 1 in T2, generated by event 33, corresponds to fully populated word 34 in T3, which is the lowest word in T3. Similarly, the fourth lowest bit of word 1 in T2, generated by event 132, corresponds to word 37 in T3, which is the fourth lowest word in T3.

In FIG. 4, the lowest set bit of word 0 in T1, generated by event 1089, corresponds to fully populated word 1 of T2. Also each set bit in word 1 corresponds to a fully populated word in T3. For example, the highest set bit in word 1 (of T2), the 32nd bit, corresponds to word 65 of T3, which is the 32nd word in T3.

Figure 5:
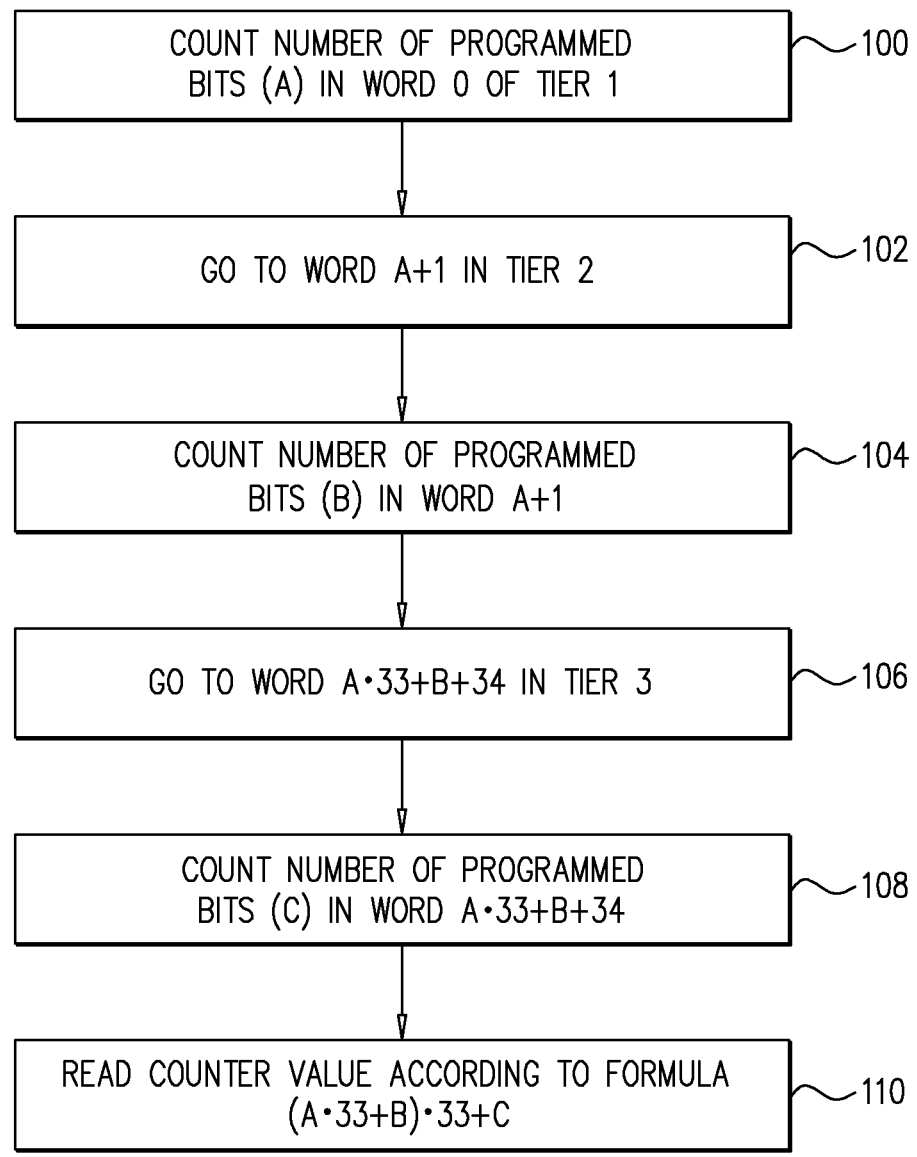
FIG. 5 is a flow chart that schematically illustrates a method for reading a counter in a memory system, in accordance with an embodiment of the present invention.

FIG. 5 is a flow chart that schematically illustrates a method for reading memory array 24, in accordance with an embodiment of the present invention. The method is illustrated by the arrows at the left of FIGS. 3 and 4. The method begins with counter logic 22 counting a number of programmed bits in word 0 of T1 and storing the count value as variable "A", at a T1 counting step 100.

After counting in step 100 is completed, at a go-to T2 step 102, counter logic 22 uses the stored value of variable "A" to evaluate a pointer A+1 pointing to word A+1 in T2, as illustrated by the upper arrows in FIGS. 3 and 4. At a T2 counting step 104, counter logic 22 counts the number of programmed bits in word A+1 at T2 and stores the count value as variable "B". At a go-to T3 step 106, counter logic 22 uses the stored values of "A" and "B" to evaluate a pointer A·33+B+34 pointing to word A·33+B+34 in T3, as illustrated by the lower arrows in FIGS. 3 and 4.

At a T3 counting step 108, counter logic 22 counts the number of programmed bits in word number A·33+B+34 at T3 and stores the count value as variable "C". At a read counter step 110, counter logic 22 evaluates the formula (A·33+B)·33+C to arrive at the count recorded in the memory.

It will be understood that only three count operations, of one word in each of the three tiers of the memory, are required in order to evaluate a current count in memory array 24. This compares to possibly needing to read up to 1123 words in prior art systems. Thus, the structure described in FIGS. 2-4 and the reading method described in FIG. 5 allows fast and accurate count evaluation by three simple reads of the number of programmed bits in three words.

Figure 6:
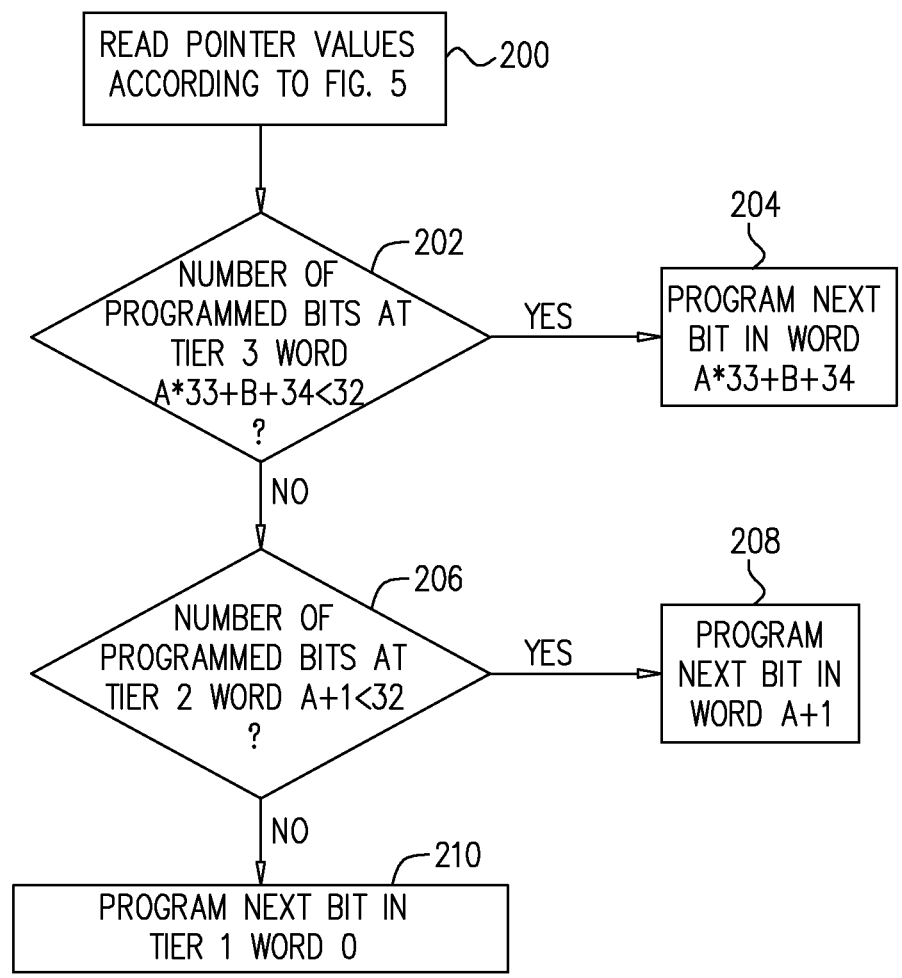
FIG. 6 is a flow chart that schematically illustrates a method for incrementing a counter in a memory system, in accordance with an embodiment of the present invention.

FIG. 6 is a flow chart that schematically illustrates a method for incrementing the counter in memory array 24, in accordance with an embodiment of the present invention. The method begins at a reading step 200, with counter logic 22 evaluating pointers A+1 and A·33+B+34 as described above with reference to FIG. 5. At a T3 decision step 202, counter logic 22 checks if the number of programmed bits at the pointed to word of T3, word A·33+B+34, is less than 32, which means the word is not fully programmed, i.e., fully populated with set bits. If the word is not fully programmed, the counter logic programs the next available unset bit at this word in T3, at a T3 programming step 204. If word A·33+B+34 is full (i.e., the number of set bits in this word is 32), then at a T2 decision step 206, counter logic 22 checks if the number of programmed bits at the pointed to word of T2, word A+1, is less than 32. If this word is not full, then, at a T2 programming step 208, counter logic 22 programs the next available unset bit at this word of T2. If word A+1 in T2 is fully programmed (with 32 bits) then counter logic 22 goes to word 0 at T1 and programs the next available unset bit in this word, at a T1 programming step 210.

This method allows fast programming of the next count in array 24 by one reading and two counting operations.

Figure 7:
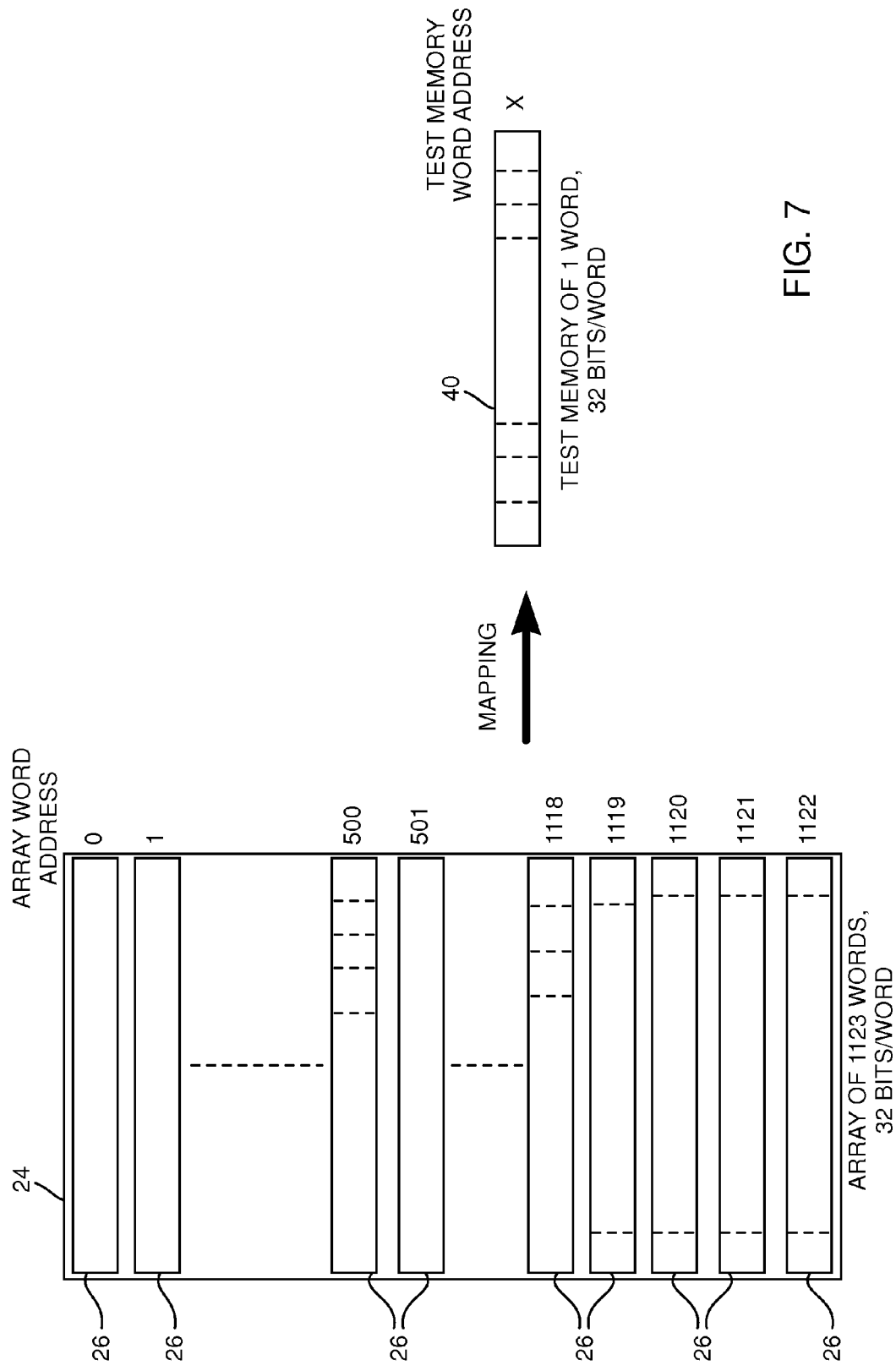
FIG. 7 is a block diagram that schematically illustrates mapping of a memory array for test purposes, in accordance with an embodiment of the present invention.

FIG. 7 is a block diagram that schematically illustrates a mapping of memory array 24 into test memory 40, in accordance with an embodiment of the present invention. The mapping is performed by address reduction device 38 (FIG. 1), and is used in the test mode, which is described below with reference to FIG. 8.

Device 38 maps addresses 0-1122 of words in array 24 to address X of the single word in test memory 40.

If the mapping is in use, it operates at both reading and incrementing the counter.

The mapping of array 24, illustrated by FIG. 7, is to a single word, and the use of this exemplary mapping is described with reference to the flow chart of FIG. 8. However, test memory 40 may be selected to have any convenient number of words, and those having ordinary skill in the art will be able to adapt the description of the flow chart, mutatis mutandis, where addresses 0-1122 of the array are mapped to multiple addresses of a test memory.

Figure 8:
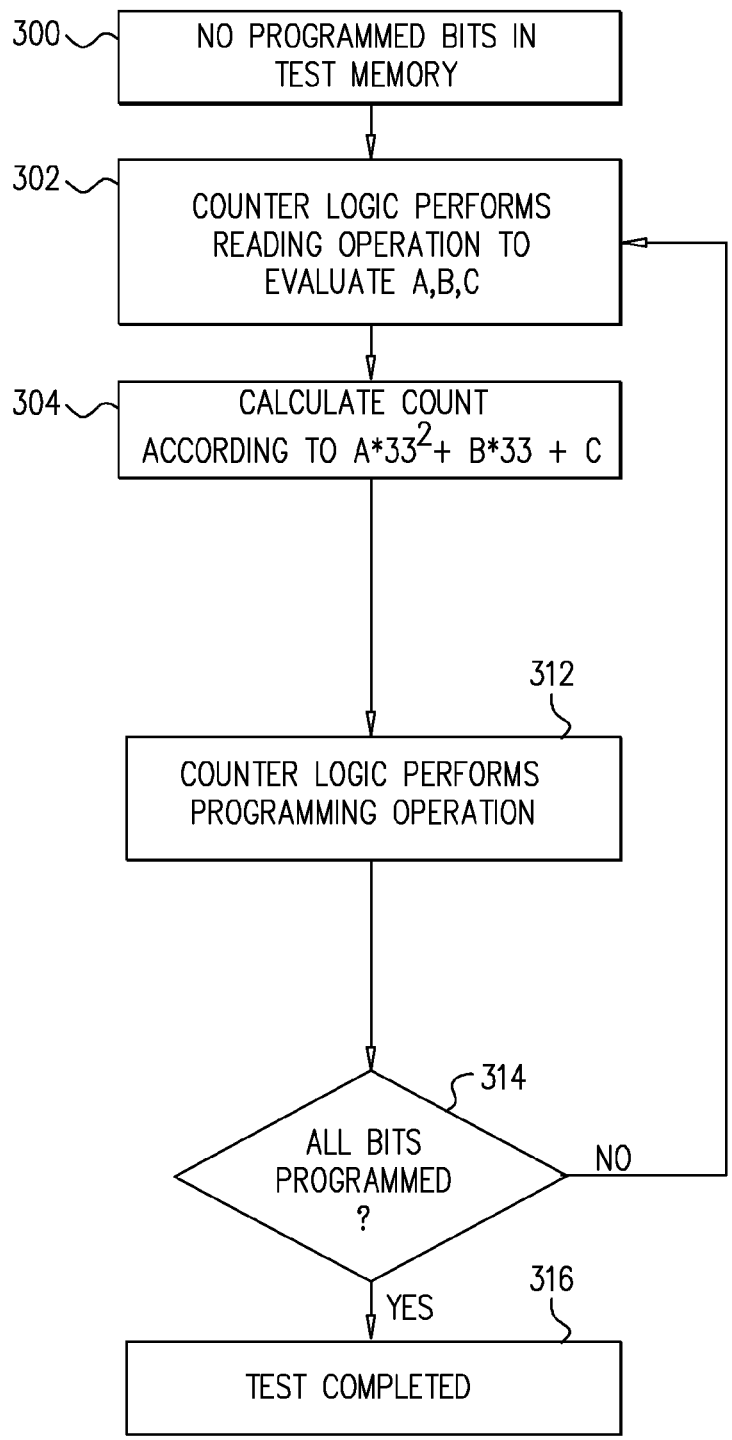
FIG. 8 is a flow chart that schematically illustrates a method for testing a counter in a memory system, in accordance with an embodiment of the present invention.

FIG. 8 is a flow chart that schematically illustrates a method for testing counter logic 22, in accordance with an embodiment of the present invention. The flow chart assumes that array 24 is mapped by reduction device 38 to a single word in test memory 40, as described above with reference to FIG. 7. The flow chart illustrates the steps performed in the test mode referred to above, wherein selector 36 toggles MUX 34 so that counter logic 22 is directed to reduction device 38, rather than to array 24. However, the counter logic is not aware of this change of direction, so that in the test mode the operations of the logic simulate receiving events and reading from, and writing to, array 24.

The method begins with an empty (i.e., no programmed bits in the) test memory, at an empty test memory step 300.

In a reading step 302 the logic attempts to read array 24 according to the steps of the flow chart of FIG. 5. Thus, logic 22 attempts to read word 0 of tier 1 in array 24. The mapping of device 38 maps array word 0 to word X in test memory 40. Thus, initially the logic reads A as 0 and generates a pointer A+1, =1, pointing to array word 1 (of tier 2). The mapping of device 38 maps array word 1 to the single word in test memory 40, so that the logic reads B as 0, and generates a pointer A·33+B+34, =34, to array word 34. Device 38 maps array word 34 to the single word of the test memory, so that the logic reads C as 0. Thus, initially A=B=C=0.

At a counting step 304, the counter logic calculates the count number from the A, B, C values found in step 302, according to the formula $A \cdot 33^2 + B \cdot 33 + C$. Since initially A=B=C=0, the count number initially returned by the logic equals 0.

At a programming step 312, counter logic 22 attempts to program the event into a word of array 24, using the flow chart of FIG. 6 to determine the address of the word. Initially, the logic attempts to set the next available bit of array word 34. Device 38 maps array word to the single word of the test memory, so that the control logic sets the next available bit of the single word. Initially this is the first bit of the single word.

At a completion decision step 314, the control logic checks if all the bits of array 24 appear to have been programmed. This will be true if all bits of test memory 40 are programmed. If yes, then, system 20 completes the testing of counter logic 22, at a test completion step 316.

If some of the bits of array 24 appear not to have been set, i.e., if one or more of the bits at test memory 40 are not programmed, the method loops back to reading step 302, and reworks the method in repeating loops, till all bits in array 24 appear to be set, i.e., when all the bits in test memory 40 are programmed.

For example, in a second iteration of the loop, at reading step 302, logic 22 attempts to read word 0, giving A=1; word 2, pointed to by A+1, and giving B=1; and word 68, pointed to by A·33+B+34 and giving C=1. Thus, at counting step 304 the values of A, B, and C, are 1 and the calculated count number returned is $33^2+33+1=1123$. At programming step 312 the logic attempts to set the next available bit of array word 68, and so, from the mapping of device 38, sets the second bit of the single word of the test memory.

In a third iteration of the loop A=B=C=2 at step 302, and the count number returned at step 304 is $2\cdot33^2+2\cdot33+2=2246$ (which equals 2·1123).

At test completion step 316, the counter has been read and incremented 32 times, and the test verifies that it returns the expected values (in this case, 32 multiples of 1123).

The description above assumes the main memory has three tiers of words, each word having 32 bits. Each word has 33 states, from no bits being set, to a fully populated word where all 32 bits are set. In this case the three tiers can store a count of 35936 events. However, it will be understood that the figures above are by way of example, so that embodiments of the present invention may organize words of a memory into any number of tiers greater than or equal to two, and each words may have a number of bits different from the 32 bits used above.

As stated above, to determine the count in the memory only one read operation is required for each tier. A general expression for the number of read operations required for a memory, in terms of the number of events the memory may count, is given by equation (1):

$$R=\lceil \log_{(b+1)} N \rceil \quad (1)$$

where R is the number of read operations required,

N is the capacity of the memory, i.e., the maximum number of events the memory can count to, and b is the number of bits in each word of the memory.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method, comprising:
    receiving a sequence of events to be counted;
    in response to each event, setting a respective bit in a memory that comprises multiple words organized in tiers, such that a number of set bits in the memory is indicative of a count of the received events, and such that each set bit in a first tier corresponds to a respective word in a second tier and is indicative of whether the corresponding word is fully populated with set bits;
    receiving a subsequent event to be counted; and
    determining a corresponding bit in the memory to set by sequentially examining the first and the second tier to determine a first word that is not fully populated, wherein the corresponding bit comprises an unset bit in the first word.

2. The method according to claim 1, and comprising:
    reading a first number of set bits in a first single word in the first tier;
    reading a second number of set bits in a second single word in the second tier pointed to by a first function of the first number; and
    evaluating the count of the received events as a second function of the first number and the second number.

3. The method according to claim 1, wherein the memory comprises a third tier, such that each set bit in the second tier corresponds to a respective further word in the third tier and is indicative of whether the corresponding further word is fully populated with set bits.

4. The method according to claim 3, wherein each word of the multiple words comprises n bits, n 2, and wherein the first tier comprises a single word, the second tier comprises (n+1) words, and the third tier comprises $(n+1)^2$ words.

5. The method according to claim 4, and comprising:
    reading a first number A of set bits in the single word of the first tier;
    reading a second number B of set bits in a second single word in the second tier pointed to by a first function (A+1);
    reading a third number C of set bits in a third single word in the third tier pointed to by a second function (n+1)·A+B+(n+2); and
    evaluating the count of the received events as $A\cdot(n+1)^2+B\cdot(n+1)+C$.

6. A method, comprising:
    providing a main memory that comprises a plurality of words, such that a number of set bits in the main memory is indicative of a count of received events;
    mapping addresses of the plurality of words to respective one or more addresses of one or more words, less than the plurality, in a test memory;
    connecting counter logic, configured to set bits in the main memory in response to receiving events, via the mapping to the test memory;
    configuring the counter logic to simulate receiving events so as to set bits in the test memory in response to the mapping; and
    configuring the counter logic to evaluate the set bits in the test memory so as to test the counter logic.

7. Apparatus, comprising:
    a memory comprising multiple words organized in tiers, such that a number of set bits in the memory is indicative of a count of received events, and such that each set bit in a first tier corresponds to a respective word in a second tier and is indicative of whether the corresponding word is fully populated with set bits; and
    counter logic, configured to receive a sequence of events to be counted, and in response to each received event to set a respective bit in the memory.

8. The apparatus according to claim 7, wherein the counter logic is configured to:
    read a first number of set bits in a first single word in the first tier,
    read a second number of set bits in a second single word in the second tier pointed to by a first function of the first number, and
    evaluate the count of the received events as a second function of the first number and the second number.

9. The apparatus according to claim 7, wherein the memory comprises a third tier, such that each set bit in the second tier corresponds to a respective further word in the third tier and is indicative of whether the corresponding further word is fully populated with set bits.

10. The apparatus according to claim 9, wherein each word of the multiple words comprises n bits, $n \geq 2$, and wherein the first tier comprises a single word, the second tier comprises $(n+1)$ words, and the third tier comprises $(n+1)^2$ words.

11. The apparatus according to claim 10, wherein the counter logic is configured to:
   read a first number A of set bits in the single word of the first tier;
   read a second number B of set bits in a second single word in the second tier pointed to by a first function $(A+1)$;
   read a third number C of set bits in a third single word in the third tier pointed to by a second function $(n+1) \cdot A + B + (n+2)$; and
   evaluate the count of the received events as $A \cdot (n+1)^2 + B \cdot (n+1) + C$.

12. The apparatus according to claim 7, wherein the counter logic is configured to:
   receive a subsequent event to be counted, and
   determine a corresponding bit in the memory to set by sequentially examining the first and the second tier to determine a first word that is not fully populated, wherein the corresponding bit comprises an unset bit in the first word.

13. Apparatus, comprising:
   a main memory comprising a plurality of words, such that a number of set bits in the main memory is indicative of a count of received events;
   a test memory, comprising one or more words less than the plurality of words in the main memory;
   a mapping device mapping addresses of the plurality of words to respective one or more addresses of the one or more words of the test memory; and
   counter logic, configured to set bits in the main memory in response to receiving events, connected via the mapping device to the test memory, the counter logic being further configured to simulate receiving events so as to set bits in the test memory in response to the mapping, and to evaluate the set bits in the test memory so as to test the counter logic.

* * * * *